United States Patent [19]
Bartlett

[11] Patent Number: 5,276,361
[45] Date of Patent: Jan. 4, 1994

[54] TTL COMPATIBLE INPUT BUFFER

[75] Inventor: Donald M. Bartlett, Fort Collins, Colo.

[73] Assignee: NCR Corporation, Dayton, Ohio

[21] Appl. No.: 796,993

[22] Filed: Nov. 25, 1991

[51] Int. Cl.$^5$ .................. H03K 19/02; H03K 3/01
[52] U.S. Cl. .................. 307/446; 307/475; 307/296.6
[58] Field of Search .......... 307/446, 455, 456, 494–6; 323/313–4

[56] References Cited

U.S. PATENT DOCUMENTS

| | | | |
|---|---|---|---|
| 4,607,177 | 8/1986 | Lechner | 307/455 |
| 4,697,109 | 9/1987 | Honma et al. | 307/475 |
| 4,698,527 | 10/1987 | Matsumoto | 307/455 |
| 4,724,343 | 2/1988 | Roux et al. | 307/475 |
| 4,748,350 | 5/1988 | Emori | 307/455 |
| 4,779,016 | 10/1988 | Sugiyama et al. | 307/475 |
| 4,782,251 | 11/1988 | Tsugaru et al. | 307/475 |
| 4,833,342 | 5/1989 | Kiryu et al. | 307/296.8 |
| 4,843,257 | 6/1989 | Ohsawa | 307/296.8 |
| 4,902,915 | 2/1990 | Tran | 307/446 |
| 4,945,263 | 7/1990 | Estrada | 307/455 |

*Primary Examiner*—Edward P. Westin
*Assistant Examiner*—Andrew Sanders
*Attorney, Agent, or Firm*—Paul W. Martin; Gregory A. Welte

[57] ABSTRACT

In general, a comparator compares the magnitude of a signal to a reference voltage, and changes its output when the latter exceeds the former. The invention concerns a reference voltage for the comparator. The reference voltage remains stable, even when the power supply voltage changes, thus keeping the switching point of the comparator constant. This constant switching point is useful in TTL logic circuits.

1 Claim, 6 Drawing Sheets

TTL COMPATIBLE INPUT BUFFER

The invention relates to input buffers for integrated circuits. In particular, the invention relates to input buffers which accommodate Transistor-Transistor Logic (TTL) levels, yet are constructed using Complementary Metal Oxide Semiconductor (CMOS) techniques.

BACKGROUND OF THE INVENTION

It is common to use a CMOS (Complementary Metal Oxide Semiconductor) inverter, such as that shown in FIG. 1, as a TTL (Transistor-Transistor Logic) input buffer. In the general case, if both transistors in FIG. 1a are sized correctly, the voltage characteristic of the inverter resembles that shown in FIG. 2. The switching point is halfway between zero and $V_{DD}$, namely, at $V_{DD}/2$.

If $V_{DD}$ changes (for example, from 5 volts to 10 volts), the switching point also changes, because the voltage characteristic changes, as indicated approximately by the phantom line 4. After the change, the switching point remains at the halfway point, at $V_{DD}/2$, but its absolute value changes, from 2.5 volts to 5 volts in this example.

This change in absolute value can cause a problem when the inverter of FIG. 1a is used as an input buffer for TTL levels. For TTL levels, the transistors are constructed so that the switching point is at 1.4 volts when $V_{DD}$ equals 5 volts. If $V_{DD}$ changes, the switching point changes, as illustrated in FIG. 2. For small changes in $V_{DD}$, the switching point remains close enough to 1.4 volts to be satisfactory. But if $V_{DD}$ changes by a large amount, such as from 5 to 10 volts as in the example above, the switching point deviates significantly from the normal TTL switching point of 1.4 volts.

Therefore, the switching point of this type of buffer is not independent of supply voltage.

OBJECTS OF THE INVENTION

It is an object of the invention to provide an improved input buffer.

It is a further object of the invention to provide an improved input buffer, in the form of an inverter which has a switching point which is relatively independent of supply voltage.

SUMMARY OF THE INVENTION

In one form of the invention, a $V_{BE}$-multiplier provides the voltage reference to one differential input of a differential amplifier. The voltage reference is substantially independent of supply voltage.

DETAILED DESCRIPTION OF THE INVENTION

Figure 3:
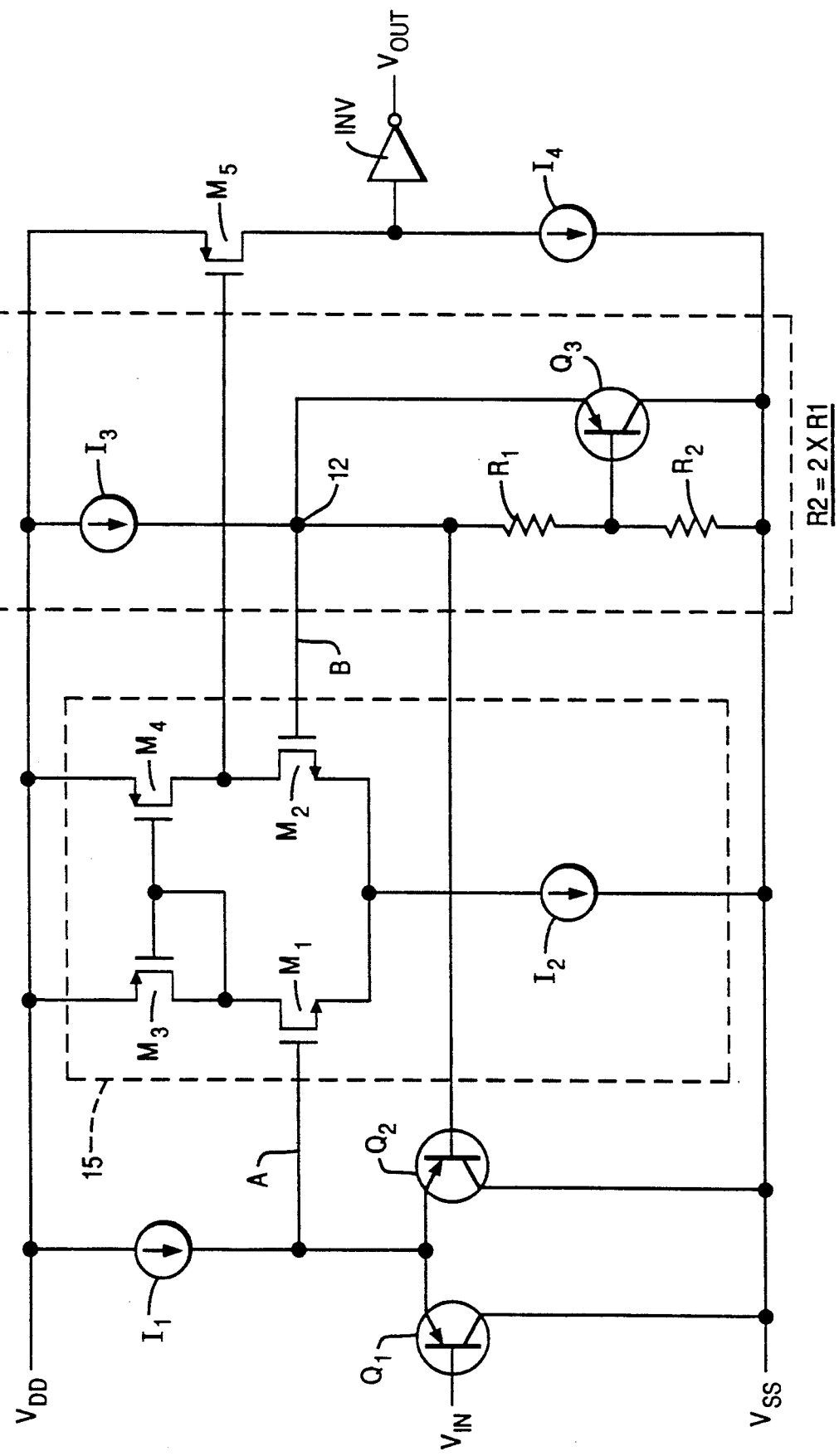
FIG. 3 illustrates one form of the invention.
Figure 4:
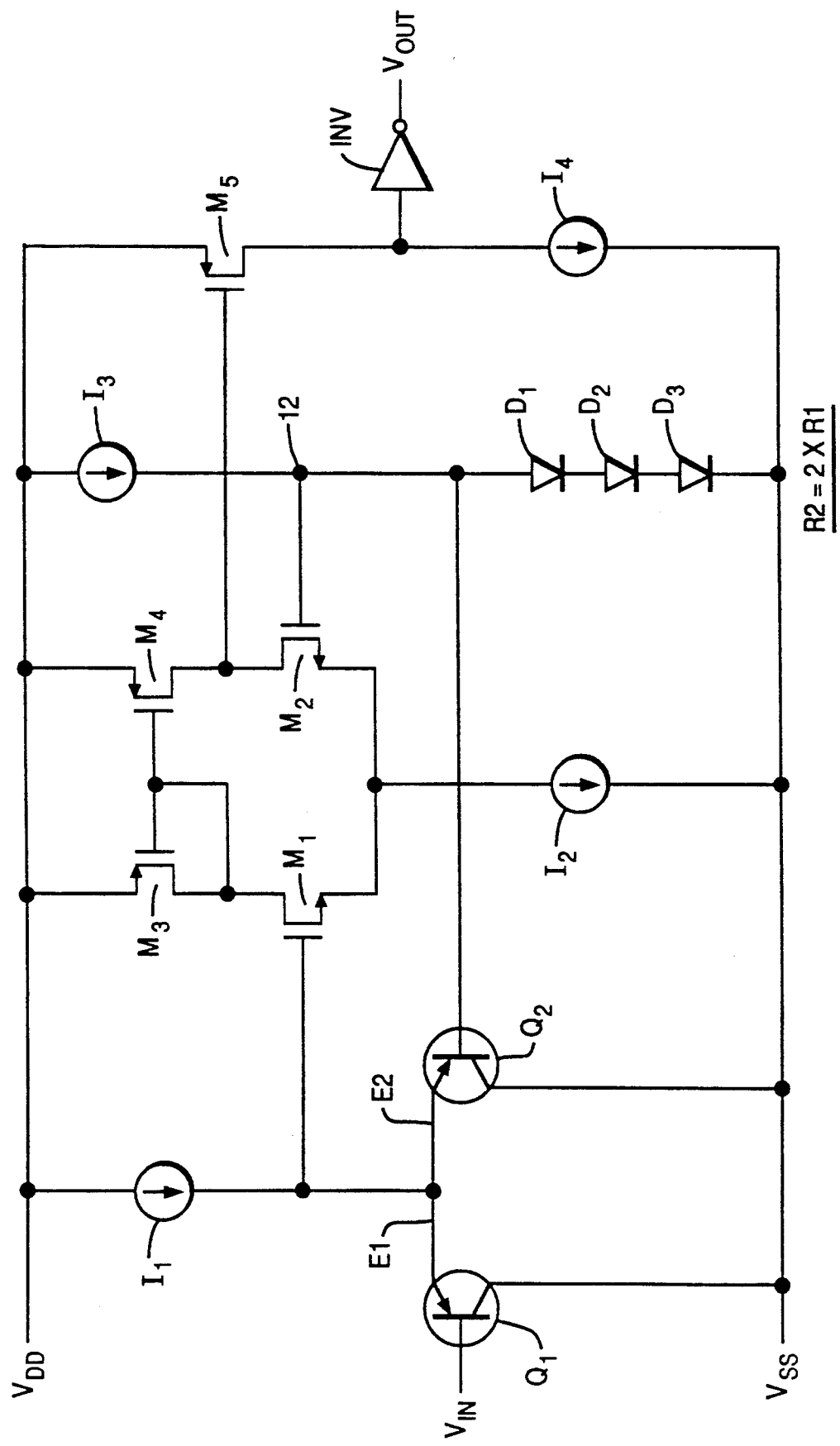
FIG. 4 illustrates another form of the invention.

FIG. 3 shows one form of the invention, and FIG. 4 shows a simplification which will be used for explanation. The difference between the figures stems from the fact that the components in box 10 in FIG. 3 form a "$V_{BE}$-multiplier," as that term is known in the art. The particular $V_{BE}$-multiplier in FIG. 3 is constructed such that the voltage drop from point 12 to $V_{SS}$ equals three diode drops. Accordingly, FIG. 4 replaces the $V_{BE}$-multiplier with three diodes D1-D3.

$V_{BE}$-multipliers will be discussed at the end of the Specification. "Diode drops" are referenced to $V_{SS}$ as zero. For example, point 12 in FIG. 4 is held at three diode drops: it is three diode drops above the voltage of $V_{SS}$.

Two situations will be considered, namely, (1) when $V_{IN}$ is logic HIGH and (2) when $V_{IN}$ is logic LOW. The HIGH case will be considered first.

$V_{IN}$ is HIGH Q2 is ON, Q1 is OFF

In FIG. 4, Q1 and Q2 form a differential amplifier. The differential inputs are the respective base leads. The base of Q2 is held at three diode drops. For explanatory purposes, assume Q1 initially to be absent. $V_{DD}$ pulls the emitter E2 of Q2 HIGH, but no higher than one diode drop above the base (which is held at three drops), because the emitter-base junction of Q2 is a diode itself. Thus, with Q1 absent, $V_{E2}$ is held at four diode drops, and Q2 is fully ON.

The situation is essentially the same if Q1 is present, but turned OFF. Q1 is OFF if $V_{IN}$ is at, for example, five diode drops. Such a voltage at $V_{IN}$ causes the base-emitter junction of Q1 to be reverse-biased. Thus, with $V_{IN}$ at five diode drops, Q1 is OFF and Q2 is fully conducting.

The situation remains the same if $V_{IN}$ is lowered to four diode drops: the base-emitter junction of Q1 is at zero volts. Q1 is still OFF, and Q2 is still deep in conduction. The rest of the circuit will be considered in more detail, under these circumstances.

With Q2 ON, M1 is ON, M2 is OFF, M5 is OFF, $V_{OUT}$ is HIGH

Because Q2 is ON, input A to the differential amplifier contained within the dashed box 15 in FIG. 3 is pulled higher than input B, by one diode drop. That is, the gate of M1 (input A) is connected to the emitter E2 of Q2, and is presently pulled to four diode drops above $V_{SS}$. Consequently, the difference between inputs A and B is one diode drop: A is at four drops and B is at three drops.

Figure 5:
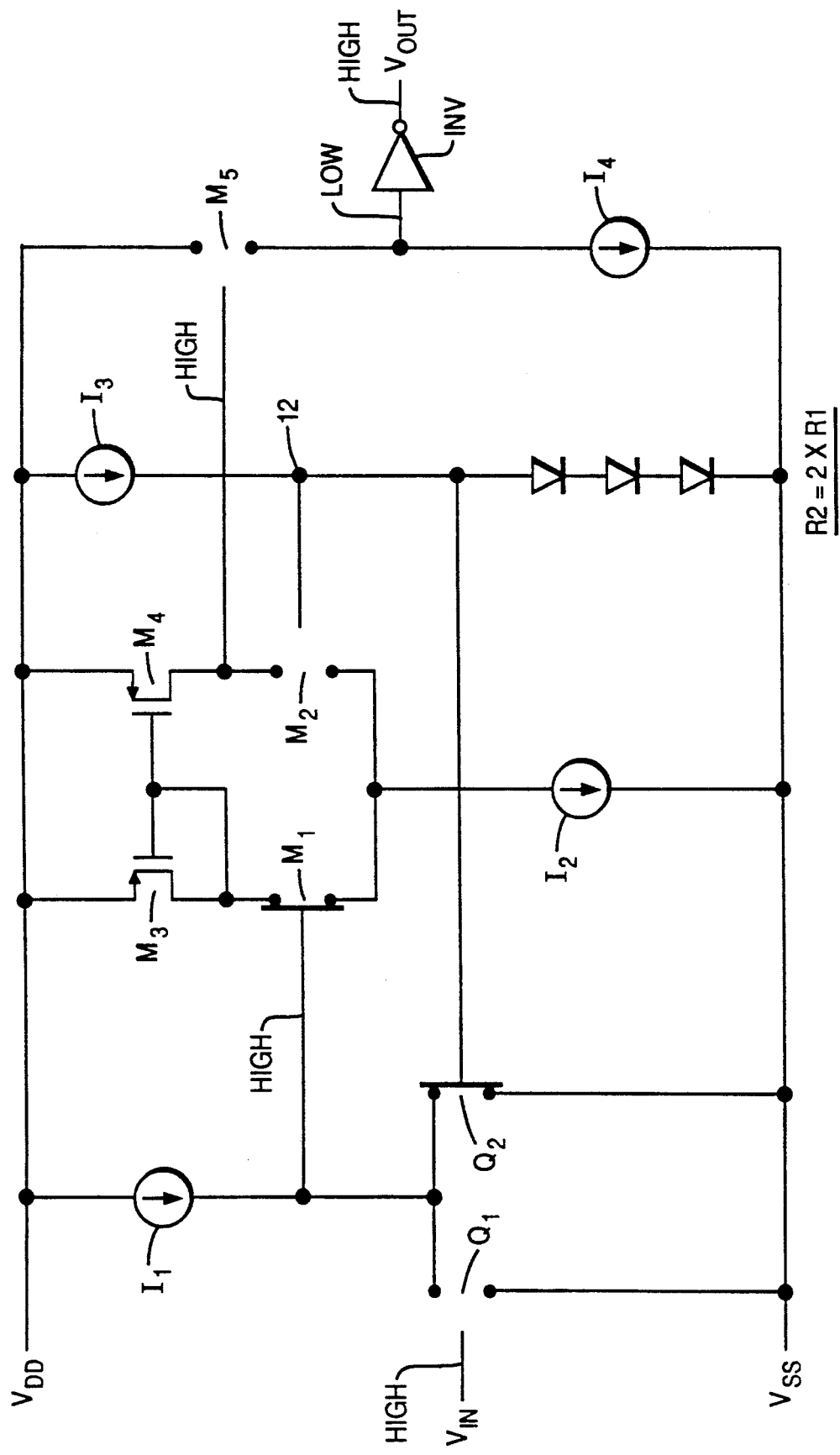
FIGS. 5 and 6 illustrate the apparatus of FIG. 3, but with the transistors replaced by switches in order to show the two different states of the apparatus.

Thus, as shown in FIG. 5 M1 is ON and M2 is OFF. Because M2 is OFF, the gate to M5 is pulled HIGH (by M4), driving M5 OFF, pulling LOW the input to inverter INV. The output OUT is driven HIGH.

Thus, when $V_{IN}$ is HIGH, the output is HIGH.

$V_{IN}$ was assumed to be at four diode drops. If $V_{IN}$ is lowered further, a transition zone is approached. When $V_{IN}$ reaches 3 diode drops, both Q1 and Q2 have equal base voltages (3 drops each), and thus both Q1 and Q2 conduct equally. As $V_{IN}$ drops further, the roles of Q1 and Q2 become reversed. When $V_{IN}$ reaches two diode drops, the E-B junction of Q2 becomes reverse-biased, and Q2 turns OFF. At this time, the gate leads of M1 and M2 are approximately equal. As $V_{IN}$ is further lowered, M1 turns OFF and the output switches states. The new state will now be considered.

With Q2 OFF, M1 is OFF, M2 is ON, M5 is OFF, $V_{OUT}$ is LOW

Figure 6:
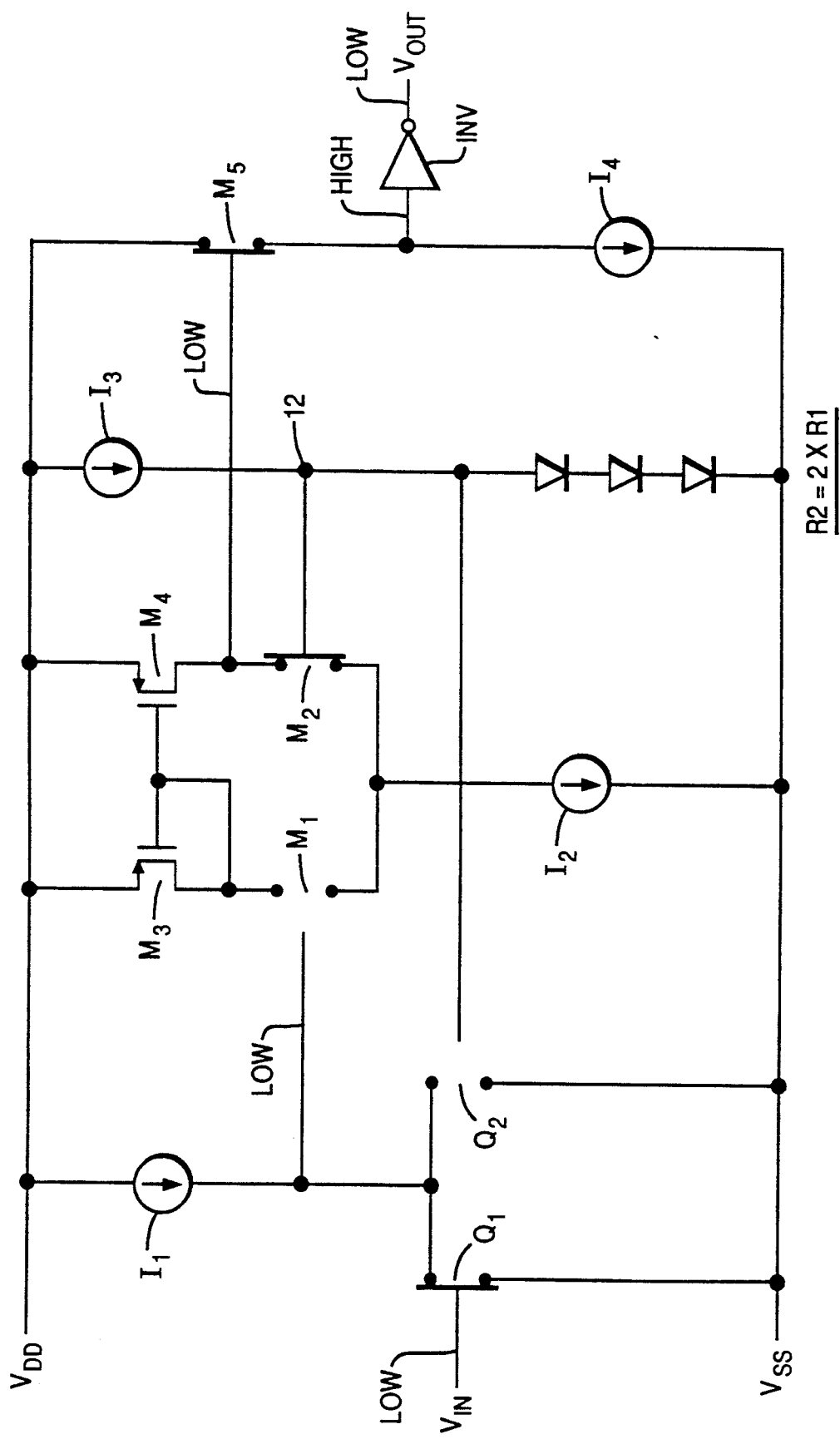

Assume $V_{IN}$ has been lowered to zero volts. Now, the emitter E1 of Q1 can not exceed one diode drop (because the emitter-base junction is a diode itself). Since emitter E1 is connected to E2, the base-emitter junction of Q2 is reverse-biased (B2 is held at three diode drops), and Q2 is turned OFF, as shown in FIG. 6.

In addition, emitter E1 is connected to the gate of M1, pulling the gate to one diode drop above $V_{IN}$ (which is zero), which turns M1 OFF. However, the gate of M2 is held at three diode drops, so that M2 is ON. With M2 ON, the gate of M5 is pulled LOW, turning M5 ON, pulling HIGH the input to inverter INV, thereby driving the output OUT LOW.

Thus, when $V_{ON}$ is LOW, $V_{OUT}$ is LOW. The device of FIG. 3 is a non-inverting buffer. If inversion is desired, the output OUT can be inverted by a second inverter.

SIGNIFICANT FEATURES

1. As discussed above, input B is held at 3 diode drops above $V_{SS}$. (One diode drop will be assumed to equal 0.7 volts.) When input A is at one diode drop above B (namely, at 2.8 or more volts above $V_{SS}$), output, $V_{OUT}$ is HIGH. When input A is at one diode drop below B (namely, at or below 1.4 volts above $V_{SS}$), $V_{OUT}$ is LOW. Therefore, the switching points for $V_{IN}$ are set at two and four diode drops, or about 1.4 and 2.8 volts. See Frederiksen, *Intuitive Operational Amplifiers* (McGraw-Hill 1988) ISBN 0-07-021966-4, page 13. This book is incorporated by reference.

2. These switching points of Q1 and Q2 were chosen for ease of illustration. In the more general case, these switching points are ($V_{E3}$ + one diode drop) and ($V_{E3}$ − one diode drop). Since the value of $V_{E3}$ is determined by the values of R1 and R2, because of the $V_{BE}$ multiplier effect (discussed below), the switching points can be selected at will. If $V_{E3}$ is set to 1.4 volts, the switching points are then set at (1.4 + 0.7, or 2.1 volts) and (1.4 − 0.7, or 0.9 volts).

Figure 7:
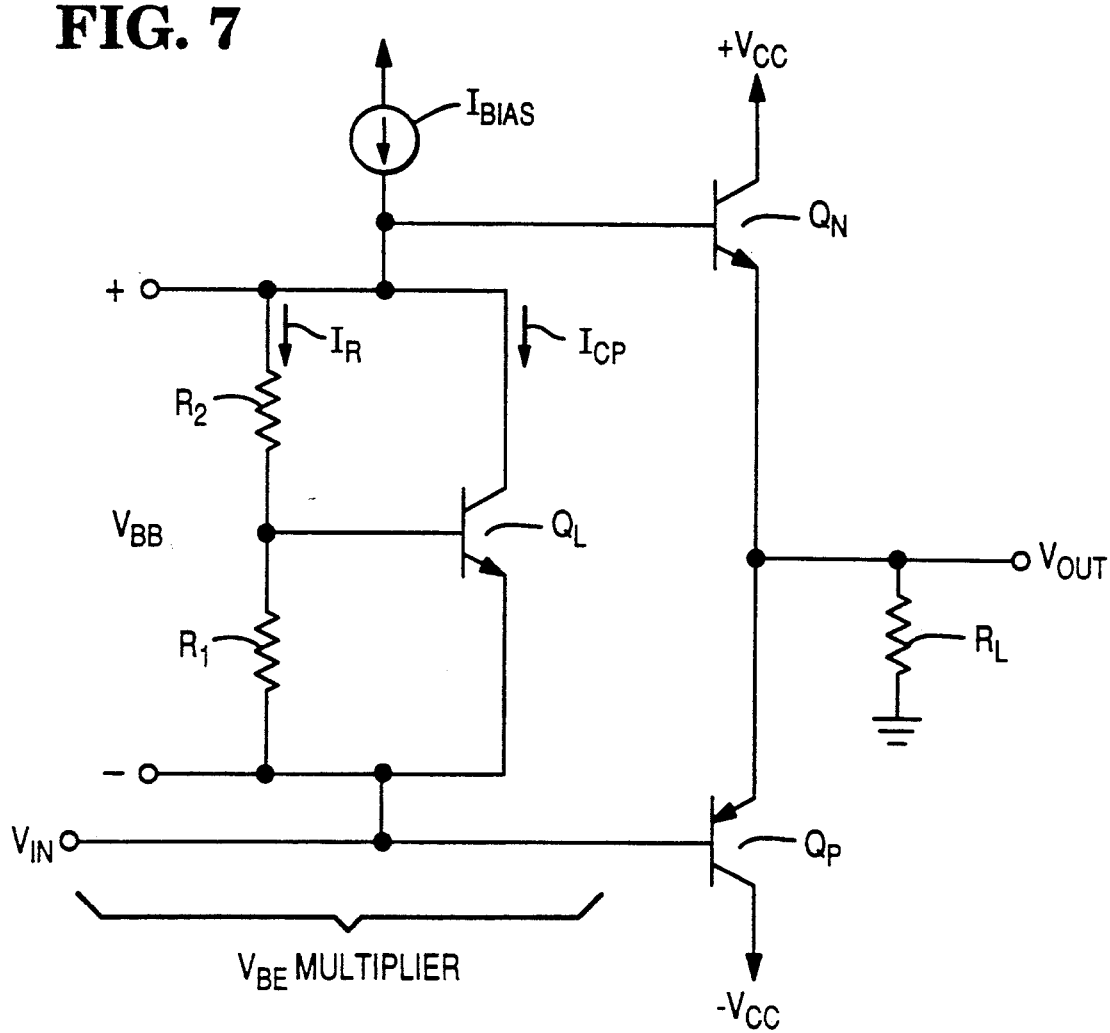
FIG. 7 shows a $V_{BE}$-multiplier, acting as bias for a class AB output stage.

3. A $V_{BE}$-multiplier was discussed above. FIG. 7 shows such a multiplier. It is known that $I_R = V_{BE1}/R_1$. It is further known that $V_{BB} = I_R(R_1 + R_2)$. Consequently, by substituting the former equation into the latter and factoring, $V_{BB} = V_{BE1}(1 + R_2/R_1)$. Thus, the circuit multiplies $V_{BE1}$ by the quantity $(1 + R_2/R_1)$. It is a "$V_{BE}$-multiplier."

In FIG. 3, $V_{EB}$ of Q3 will equal one diode drop, because Q3 is biased heavily into conduction. Thus, the gate voltage will be held at three diode drops above $V_{SS}$, because the quantity $(1 + R_2/R_1)$ equals 3, because $R_2$ is twice $R_1$ in value. See Sedra and Smith, *Microelectronic Circuits* (Holt, Rhinehart & Winston 1987), ISBN 0-03-007328-6, pages 566-568. This book is incorporated by reference.

Figure 1A:
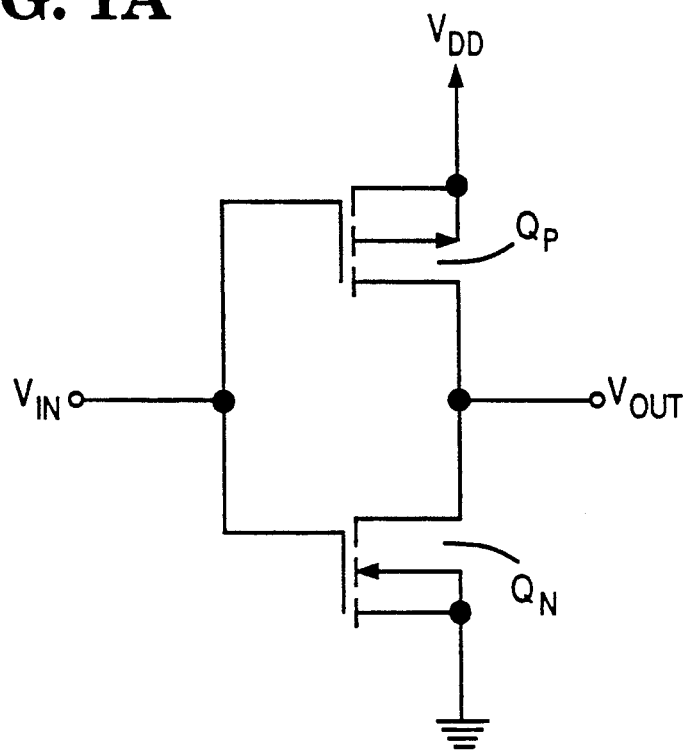
FIG. 1a-b illustrates prior-art CMOS input buffers.
Figure 1B:
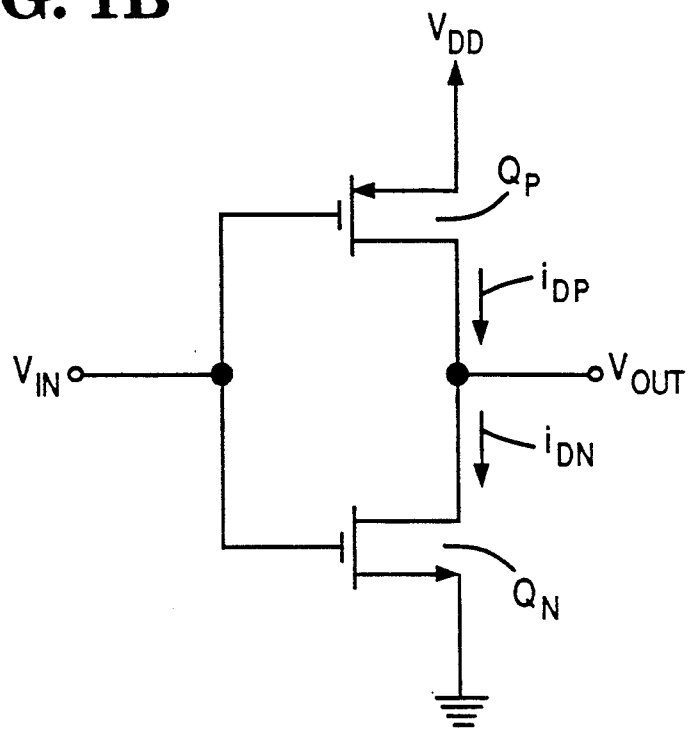
Figure 2:
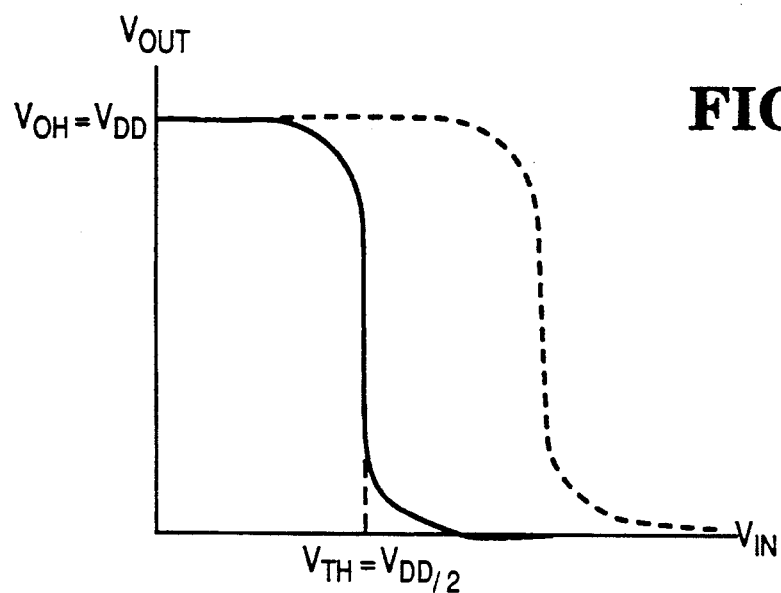
FIG. 2 illustrates how the transfer characteristic of the buffers of FIGS 1a-b changes as supply voltage changes.

4. In contrast to the CMOS inverter of FIG. 1, the switching point does not change with supply voltage. For example, with the invention, if $V_{DD}$ in FIG. 3 changes from 5 volts to ten volts, the switching point will not change by more than about four percent. In contrast, with the prior-art CMOS inverter, the doubling of the supply voltage doubled the switching point.

The primary reason for the difference is the stability of the reference voltage in the invention. The reference voltage is that at the base of Q2. The reference voltage is supplied by the $V_{BE}$-multiplier. The only term in the equation for the $V_{BE}$-multiplier which could be affected by a rise in $V_{DD}$ is $V_{EB}$ of Q3. However, as an elementary knowledge of transistor operation shows, doubling of $V_{DD}$ does not significantly change $V_{BE}$. ($V_{BE}$ will not change by more than about 3 percent if $V_{DD}$ doubles.) $V_{BE}$ can thus be termed substantially independent of changes in supply voltage, $V_{DD}$.

5. Diodes can actually be used to implement the invention, as shown in FIG. 4, instead of the $V_{BE}$ multiplier.

6. The output stage, comprising M5 and the inverter INV in FIG. 3, is controlled by the switching state of M2. However, if the gate of M5 were connected to the drain of M1 instead of M2, the apparatus would be a non-inverting buffer, instead of the inverting buffer discussed above.

Numerous substitutions and modifications can be undertaken without departing from the true spirit and scope of the invention. What is desired to be secured by Letters Patent is the Invention as defined in the following claims.

I claim:

1. An input buffer for an integrated circuit, comprising:
    a) a first differential amplifier stage, comprising
        i) a pair of bipolar junction transistors (Q1 and Q2) whose emitters are coupled together, and
        ii) a first constant source (I1) in series with the emitters;
    b) a second differential amplifier stage, comprising
        i) a pair of field-effect transistors (M1 and M2) whose sources are coupled together,
        ii) a second constant current source (I2) in series with the sources, and
        iii) a connection between the gate of one of the field-effect transistors and the coupled emitters;
    c) a $V_{BE}$-multiplier, which provides a reference voltage to both the gate of the other of the field-effect transistors and one of the bipolar junction transistors; and
    d) an output stage whose state is controlled by the state of either the one or the other field-effect transistors.

* * * * *